(12) United States Patent
Li

(10) Patent No.: US 11,527,641 B2
(45) Date of Patent: Dec. 13, 2022

(54) HIGH-ELECTRON-MOBILITY TRANSISTOR WITH HIGH VOLTAGE ENDURANCE CAPABILITY AND PREPARATION METHOD THEREOF

(71) Applicant: Guangdong Zhineng Technology Co., Ltd., Guangzhou (CN)

(72) Inventor: Zilan Li, Guangzhou (CN)

(73) Assignee: GUANGDONG ZHINENG TECHNOLOGY CO., LTD.

( * ) Notice: Subject to any disclaimer, the term of this patent is extended or adjusted under 35 U.S.C. 154(b) by 151 days.

(21) Appl. No.: 16/806,741

(22) Filed: Mar. 2, 2020

(65) Prior Publication Data

US 2021/0066481 A1 Mar. 4, 2021

(30) Foreign Application Priority Data

Aug. 30, 2019 (CN) .......................... 201910822403.7

(51) Int. Cl.
| | |
|---|---|
| *H01L 29/40* | (2006.01) |
| *H01L 29/778* | (2006.01) |
| *H01L 29/66* | (2006.01) |
| *H01L 29/08* | (2006.01) |
| *H01L 21/02* | (2006.01) |

(52) U.S. Cl.
CPC ........ *H01L 29/778* (2013.01); *H01L 29/0847* (2013.01); *H01L 29/66431* (2013.01); *H01L 21/02645* (2013.01)

(58) Field of Classification Search
None
See application file for complete search history.

(56) References Cited

U.S. PATENT DOCUMENTS

| | | |
|---|---|---|
| 2003/0209759 A1 | 11/2003 | Blanchard |
| 2006/0138456 A1 | 6/2006 | Parikh et al. |
| 2012/0119218 A1 | 5/2012 | Su |
| 2015/0123139 A1* | 5/2015 | Kim ................. H01L 29/66462 438/172 |
| 2015/0144953 A1* | 5/2015 | Hill ..................... H01L 29/7787 438/172 |
| 2015/0144957 A1* | 5/2015 | Lu ...................... H01L 29/0607 257/76 |
| 2019/0280100 A1* | 9/2019 | Curatola ............ H01L 29/0692 |
| 2020/0119176 A1* | 4/2020 | Dasgupta ............. H01L 29/205 |

* cited by examiner

*Primary Examiner* — Ali Naraghi
(74) *Attorney, Agent, or Firm* — Dinsmore & Shohl LLP

(57) ABSTRACT

The present disclosure relates to semiconductor power devices, and in particular, to a high-electron-mobility transistor (HEMT) with high voltage endurance capability and a preparation method thereof. The high-electron-mobility transistor with high voltage endurance capability includes a gate electrode, a source electrode, a drain electrode, a barrier layer, a P-type nitride semiconductor layer and a substrate, wherein the P-type nitride semiconductor layer is between the barrier layer and the substrate, which is insufficient to significantly deplete a two-dimensional electron gas in a channel except a gate stack, the source electrode is in electrical contact with the P-type nitride semiconductor layer, and the source electrode and the drain electrode are both in electrical contact with the two-dimensional electron gas.

26 Claims, 5 Drawing Sheets

HIGH-ELECTRON-MOBILITY TRANSISTOR WITH HIGH VOLTAGE ENDURANCE CAPABILITY AND PREPARATION METHOD THEREOF

CROSS-REFERENCE TO RELATED APPLICATIONS

The present disclosure claims the priority of Chinese Patent Application No. 201910822403.7, filed with the Chinese Patent Office on Aug. 30, 2019 and entitled "High-electron-mobility Transistor with High Voltage Endurance Capability", the contents of which is incorporated herein by reference in its entirety.

BACKGROUND ART

Group III nitride semiconductors are important novel semiconductor materials, mainly including AlN, GaN, InN and chemical compounds of these materials, such as AlGaN, InGaN, AlInGaN, etc. Because of the advantages of direct band gap, wide band gap (forbidden band) and high breakdown electric field intensity, Group III nitride semiconductors represented by GaN have a wide application prospect in fields of light-emitting devices, power electronics, radio frequency devices, etc.

SUMMARY

Embodiments of the present disclosure provide a high-electron-mobility transistor, comprising a gate electrode, a source electrode, a drain electrode, a barrier layer, a P-type nitride semiconductor layer and a substrate, wherein the P-type nitride semiconductor layer is between the barrier layer and the substrate, which is insufficient to significantly deplete a two-dimensional electron gas in a channel except a gate stack, the source electrode is in electrical contact with the P-type nitride semiconductor layer, and the source electrode and the drain electrode are both in electrical contact with the two-dimensional electron gas.

Embodiments of the present disclosure further provide a method for preparing the high-electron-mobility transistor, comprising steps of, forming a P-type nitride semiconductor layer on the nucleation layer by selective/lateral epitaxial growth, controllably changing a doping concentration of the P-type nitride semiconductor layer during the selective/lateral epitaxial growth to regulate the doping of the P-type nitride semiconductor layer according to different regions, and then forming an electrode structure, wherein a projection plane of the source electrode on the substrate partially coincides with a projection plane of the nucleation layer on the substrate.

BRIEF DESCRIPTION OF DRAWINGS

In order to more clearly illustrate the technical solutions of the embodiments of the present disclosure, brief description is made below on the drawings required to be used in the embodiments of the present disclosure. It should be understood that the following drawings only illustrate some of the embodiments of the present disclosure and therefore shall not be construed as a limitation on the scope. For a person of ordinary skills in the art, other related drawings may be obtained from these drawings without inventive effort.

DETAILED DESCRIPTION OF EMBODIMENTS

Below, the technical solutions in the embodiments of the present disclosure will be described with reference to the drawings of the embodiments of the present disclosure.

It should be noted that like reference signs and letters denote like items in the following drawings, and therefore, once a certain item is defined in one figure, it does not need to be further defined or explained in the following figures. Moreover, in the description of the present disclosure, the terms such as "first" and "second" are only used for differentiated description and cannot be understood as indication or implication of relative importance. The terms "upper", "lower", etc. represent relative positional relations, and do not indicate that the two parts referred to are in direct close proximity.

A high-electron-mobility transistor (HEMT) is an important Group III nitride semiconductor device, which has a great prospect in the field of power semiconductors. Because of the presence of spontaneous polarization and piezoelectric polarization effects, there are strong polarized positive charges at the interface between GaN and AlGaN on the (0001) plane. The presence of these polarized positive charges will attract electrons and result in the generation of two-dimensional electron gas at the interface. The two-dimensional electron gas has a very high carrier concentration and a very high carrier mobility, and is a core constituent part in manufacturing of high-electron-mobility transistors (HEMT).

Figure 1:
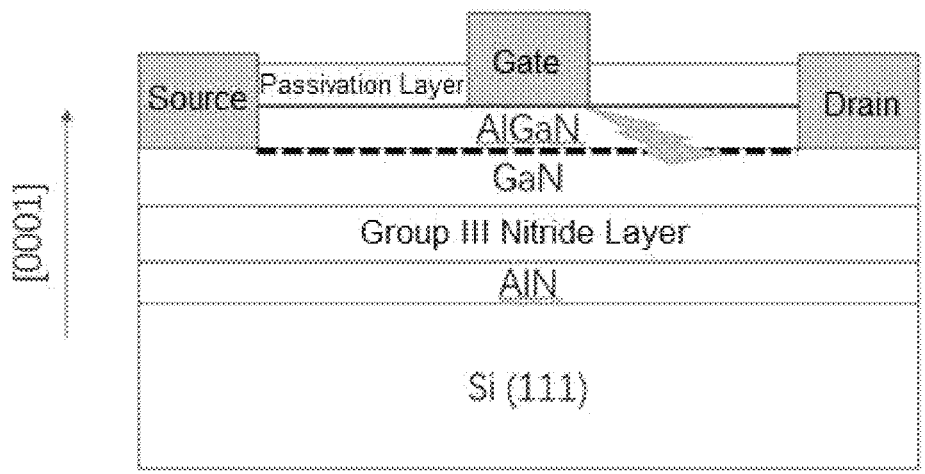
FIG. 1 shows a device structure of a typical HEMT in the prior art.

FIG. 1 shows a typical HEMT structure. The two-dimensional electron gas conducts current between a source and a drain. A gate electrode controls the switching of the device. It should be noted that the source, drain and gate electrodes are located on the same side of the device in this structure. When the device is in the off state, the source and the gate are both in the low voltage state (usually within ±20 V), but the drain electrode may be subjected to a voltage of several tens of volts to several hundreds of volts or even thousands of volts applied thereto. The application of such a high voltage to the device results in a very strong electric field inside the device. Moreover, the distribution of the electric field inside the device is not uniform, and a local electric field intensity may be much higher than the average electric field intensity. These local high electric field intensities may be close to or even exceed the breakdown electric field intensity of the materials used for the device, resulting in breakdown, electric leakage, or reliability problems of the device. Therefore, the prevention of occurrence of high-intensity local electric fields or the reduction of the intensities of local electric fields is critical to the improvement of the overall performance and reliability of the device.

The electric field intensity at the edge of the gate electrode (as shown in FIG. 1) is usually very high, and with such a high electric field intensity in the vicinity of the gate stack which is the weakest and core part of the device, the problems such as leakage, breakdown and low reliability of the gate at high electric fields are likely to occur, which needs particular attention. A common way to reduce the local electric field is to use field plate structures. These field plate structures change the distribution of the electric field and can reduce excessively high local electric field. However, the field plate structure usually uses a metal material, which still causes a problem of point discharge, and peaks of electric fields still exist locally.

In addition, generally the Al Ga N/Ga N heterojunctions have already been formed with conducting channels for high-density two-dimensional electron gas, when the preparation of materials is completed. For this reason, the conventional Al Ga N/Ga N HEMT devices are all of depletion mode (with a threshold voltage Vth<0), which require a negative bias voltage to be applied to the gate in order to be in the off state, therefore these devices are normally on devices. However, in the field of power switching devices, there is a strong need for normally off devices. The GaN enhancement device technology has attracted great attention of researchers. After many years of development, the methods for realizing enhancement devices mainly include the technologies such as thin barrier layer, trench gate and under-gate fluorine ion implantation.

The basic principles of the present disclosure include introducing a P-type nitride semiconductor layer to regulate the distribution of electric field by the doping-modulation technique, and enhancing the voltage endurance capability of the HEMT device and realizing enhancement devices.

The P-type nitride semiconductor layer is under the two-dimensional electron gas and away from the gate, drain and other electrodes. If the barrier layer of the two-dimensional electron gas is vertical to the substrate, the P-type nitride semiconductor layer may also be on a side of the barrier layer.

When the device is in the off state, the two-dimensional electron gas is depleted, leaving positive charges which are on the channel substrate. Holes in the P-type nitride semiconductor layer move under the effect of the positive electric field of the drain, leaving negative charges of the substrate in some regions. These negative charges effectively cancel the influence of the positive charges at the channels and reduce the intensity at local high electric fields.

In the high-electron-mobility transistor provided in the embodiments of the present disclosure, the doping concentration of a strong doping generally refers to a doping concentration of $2E18/cm^3$ or above, which may even be as high as $5E19/cm^3$ or above. The doping concentration of a light doping is generally below $2E18/cm^3$, which is generally on the scale of $2E17/cm^3$. In HEMTs, strong doping or light doping is relative, which is related to the concentration of the two-dimensional electron gas at the channel layer/barrier layer interface.

Figure 2:
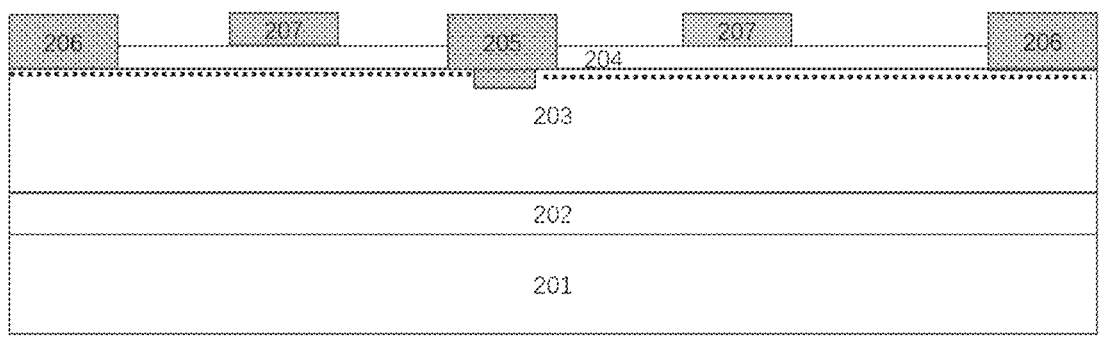
FIG. 2 shows the device structure of an HEMT provided in one embodiment of the present disclosure.

Referring to FIG. 2, FIG. 2 shows a HEMT with high voltage endurance capability provided in an embodiment of the present disclosure, comprising a nucleation layer 202 formed on a substrate 201 (some devices with specific substrate materials may not include a nucleation layer); a P-type nitride semiconductor layer 203 epitaxially formed on the nucleation layer 202; and a barrier layer 204 formed on the P-type nitride semiconductor layer 203. The P-type nitride semiconductor layer 203 is in contact with the barrier layer 204 to form a heterojunction structure, and a two-dimensional electron gas formed at the interface between the P-type nitride semiconductor layer 203 and the barrier layer 204. A source electrode 205 is electrically connected with the two-dimensional electron gas and the P-type nitride semiconductor layer 203, generally, the source electrode 205 has a fixed electric potential, a drain electrode(s) 206 is(are) in contact with the two-dimensional electron gas, and a gate electrode(s) 207 is(are) on the barrier layer. The P-type nitride semiconductor layer 203 is of a weak P-type, which has a relatively low concentration of holes or P-type impurities, which will not severely deplete the two-dimensional electron gas at the interface between the barrier layer 204 and the P-type nitride semiconductor layer 203, that is, a two-dimensional electron gas with a relatively high concentration exists at the interface between the P-type nitride semiconductor layer 203 and the barrier layer 204; and when turned on, the HEMT is realized by controlling different voltages of the gate and the drain. By selecting a suitable material of the gate electrode, it is also possible to partially or completely deplete the two-dimensional electron gas at the gate stack in order to realize a normally off device, while maintaining a relatively high two-dimensional electron gas concentration in other regions in order to achieve a great conductive property. The P-type nitride semiconductor layer is at least partially in a region between the source electrode and the gate electrode and a region between the gate electrode and the drain electrode, and except the gate stack region, the concentration of the channel two-dimensional electron gas depleted by the P-type nitride semiconductor layer is smaller than 80% of the concentration of the channel two-dimensional electron gas in the case where there is no P-type nitride semiconductor layer, that is, at least 20% of the two-dimensional electron gas is retained.

In the above, the basic requirement on the source electrode is to form an ohmic contact with the two-dimensional electron gas and the P-type nitride semiconductor layer 203. In such a case, a portion of the source electrode in contact with the two-dimensional electron gas and a portion of the source electrode in contact with the P-type nitride semiconductor layer 203 may be of the same material or different materials. Since a relatively high voltage is usually applied to the drain electrode with, if the drain electrode is in contact with the P-type nitride semiconductor layer 203, a relatively large leakage current will be generated during operation, resulting in unstable operation or even failure of the device. Therefore, in the device structure provided in the present embodiment of the present disclosure, in order to prevent the drain electrode from being electrically connected to the P-type nitride semiconductor layer, the drain electrode is only inserted into the barrier layer to be electrically connected to the two-dimensional electron gas.

The gate electrode 207 is in Schottky contact to reduce the off-state leakage current.

Figure 3:
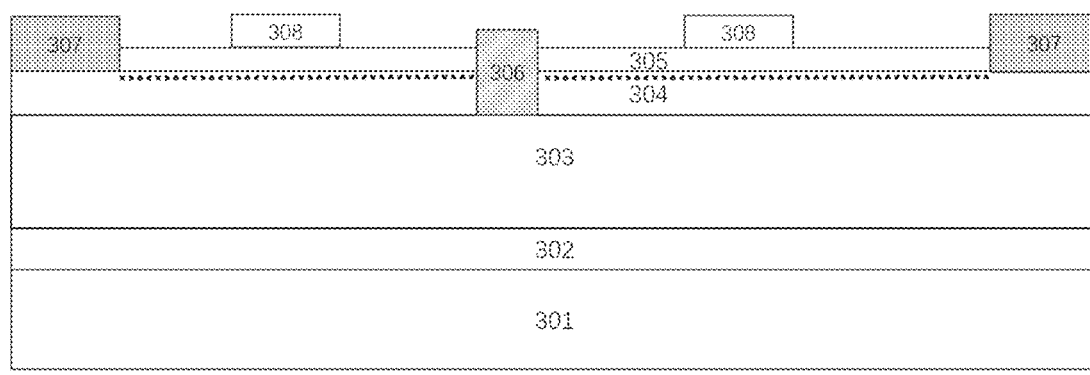
FIG. 3 shows the device structure of an HEMT provided in another embodiment of the present disclosure.

FIG. 3 shows another HEMT with high voltage endurance capability provided in an embodiment of the present disclosure, the structure of which comprises: a nucleation layer 302 formed on a substrate 301; a P-type nitride semiconductor layer 303 epitaxially formed on the nucleation layer 302; a low doped or unintentionally doped nitride semiconductor layer 304 formed on the P-type nitride semiconductor layer 303; and a barrier layer 305 formed on the low doped or unintentionally doped nitride semiconductor layer 304. The low doped or unintentionally doped nitride semiconductor layer 304 and the barrier layer 305 form a heterojunction structure, and a two-dimensional electron gas is formed at the interface between the low doped or unintentionally doped nitride semiconductor layer 304 and the barrier layer 305. A source electrode 306 is electrically connected to the two-dimensional electron gas and the P-type nitride semiconductor layer 303, generally, the source electrode 306 has a fixed electric potential, a drain electrode(s) 307 is(are) in contact with the two-dimensional electron gas, and a gate electrode(s) 308 is(are) located on the barrier layer.

Since doping in the P-type nitride semiconductor layer 303 will bring forth a remarkable carrier scattering effect, when an unintentionally doped or low doped channel layer 304 is formed between the barrier layer 305 and the P-type nitride semiconductor layer 304, scattering received by the two-dimensional electron gas when flowing through the channel layer 304 can be greatly weakened.

The source electrode 306 is connected with the P-type nitride semiconductor layer 304, generally, the source electrode 306 has a fixed electric potential, the drain electrode 307 is in contact with the channel layer and the two-dimensional electron gas on the channel layer, and the gate electrode 308 is on the barrier layer 305. The P-type nitride semiconductor layer 304 will not significantly deplete the two-dimensional electron gas in the channel except that in the gate stack; and when turned on, the HEMT is realized by controlling different voltages of the gate and the drain. By selecting a suitable material of the gate electrode 308, it is also possible to partially or completely deplete the two-dimensional electron gas at the gate stack in order to realize a normally off device, while maintaining a relatively high two-dimensional electron gas concentration in other regions in order to achieve a great conductive property.

Figure 4:
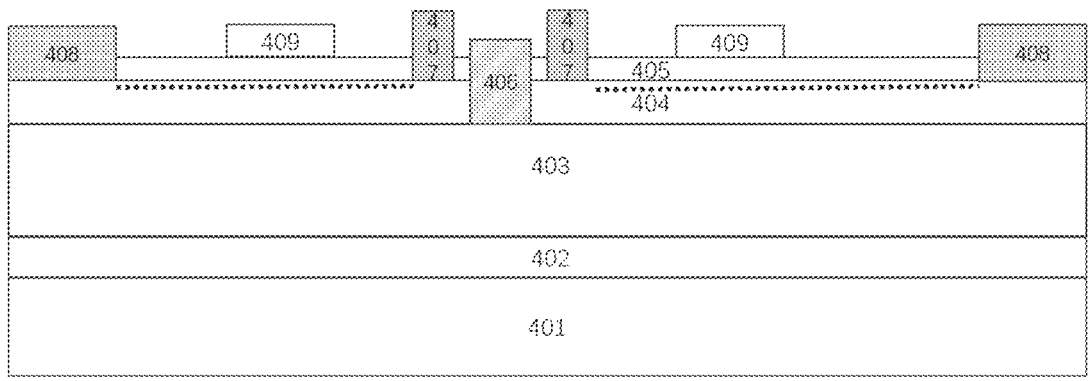
FIG. 4 shows the device structure of an HEMT provided in another embodiment of the present disclosure.

FIG. 4 shows another HEMT with high voltage endurance capability provided in an embodiment of the present disclosure, the structure of which comprises: a nucleation layer 402 formed on a substrate 401; a P-type nitride semiconductor layer 403 epitaxially formed on the nucleation layer 402; a low doped or unintentionally doped nitride semiconductor layer 404, which serves as a channel layer, formed on the P-type nitride semiconductor layer 403; and a barrier layer 405 formed on the low doped or unintentionally doped nitride semiconductor layer 404. The low doped or unintentionally doped nitride semiconductor layer 404 and the barrier layer 405 form a heterojunction structure, and a two-dimensional electron gas is formed at the interface between the low doped or unintentionally doped nitride semiconductor layer 404 and the barrier layer 405. A source electrode(s) 407 and a drain electrode(s) 408 are electrically connected with the two-dimensional electron gas on the channel layer 404, and a gate electrode(s) 409 is(are) on the barrier layer 405 and is in contact with the P-type nitride semiconductor layer 403 via a body electrode 406. The body electrode 406 is configured to control the electric potential of the P-type nitride semiconductor layer 403 and to control the source electrode, the drain electrode, and the gate electrode to realize the stable operation of the HEMT, and a quick turn-off operation of the HEMT can be realized by controlling the electric potential of the independent body electrode 406.

Figure 5:
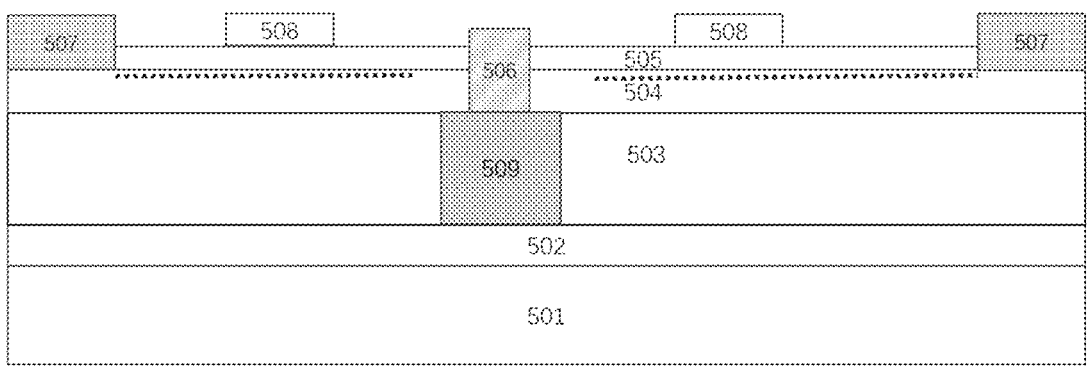
FIG. 5 shows the device structure of an HEMT provided in another embodiment of the present disclosure.

FIG. 5 shows another HEMT with high voltage endurance capability provided in an embodiment of the present disclosure, which is distinguished from FIG. 3 in that strong P-type doping is performed in a region of a corresponding P-type nitride semiconductor layer 503 electrically connected to a source electrode 506 to form a strongly doped P-type region 509, a gate electrode(s) 508 is(are) located on a barrier layer 505, a drain electrode(s) 507 is(are) electrically connected with a two-dimensional electron gas at the interface between a channel layer 504 and the barrier layer 505, and a good ohmic contact is formed between the source electrode 506 and a strongly-doped P-type region 509 formed by ion implantation or epitaxial growth in the P-type nitride semiconductor layer 503, so as to control the electric potential of the P-type nitride semiconductor layer 503. When turned on, the HEMT is realized by controlling different voltage potentials of the gate and the drain, and the voltage potential of the P-type nitride semiconductor layer 503.

In the above, the strongly doped P-type region 509 is formed in two ways as follows:

In one example, after the completion of the formation of a nucleation layer 502 on a substrate 501 and the growth of the P-type nitride semiconductor layer 503, the strongly doped P-type region 509 may be formed by local ion implantation of P-type impurities, which is conducive to the formation of control of ohmic contact with the P-type nitride semiconductor layer. In another example, it is also feasible to form, by using the doping-modulation technique, the strongly doped P-type region 509 first on the nucleation layer 502 by selective/laterally epitaxial growth, and then form a complete P-type nitride semiconductor layer 503, so as to improve the quality of the subsequent P-type ohmic contact and reduce the contact resistance. For the P-type nitride semiconductor layer 503, light doping or no doping is performed when selective/lateral epitaxial growth gets close to a preset portion of the drain electrode 507. After the completion of the growth of the P-type nitride semiconductor, a low doped or undoped semiconductor layer is grown, so that the channel layer 504 on the upper surface of the P-type nitride semiconductor layer 503 is undoped. It is also feasible to partially remove the upper surface nitride semiconductor layer 503 by a planarization or etching process after the selective/lateral epitaxial growth of the P-type nitride semiconductor, and then epitaxially form a barrier layer structure or a channel layer and barrier layer structure at the same time, so as to prevent an inappropriate doping concentration from partially changing the energy band structure at the channel, which affects the concentration of the two-dimensional electron gas and the normal operation of the HEMT.

Ion implantation of P-type impurities is performed locally on the P-type nitride semiconductor layer 503 to form a strongly doped P-type region 509, such P-type doping impurities are not uniformly distributed in most cases, but under certain distribution conditions, it is possible to accomplish the functions, e.g., reducing the peaks of the electric field more effectively, or being more conducive to the realization of ohmic contact. Typical P-type doping impurities include P-type doping atoms such as magnesium and zinc.

The modulation of the concentration of hole carriers may also achieve the object of locally reducing the concentration of hole carriers by reducing the activation degree of local P-type doping through local ion implantation of passivation impurities, and in this way, the distribution of hole carriers can also be adjusted, thereby achieving the object of fine regulation of electric field distribution. Typical passivation impurities are, for example, C, N, Ar, etc.

In addition to the basic structures of the embodiments represented by FIGS. 2-5, there may be other related arrangements, for example, a passivation layer, a cap layer, various field plate structures, additional electrode structures that are configured to control the uniformity of the channel electric field, etc., are provided on the barrier layer; structure layers such as a gate dielectric layer and a P-GaN layer may be provided under the gate electrode. The arrangement of these related functional structures and the arrangement of other disclosed functional structures of the HEMT are not excluded from the embodiments of the present disclosure.

Figure 6:
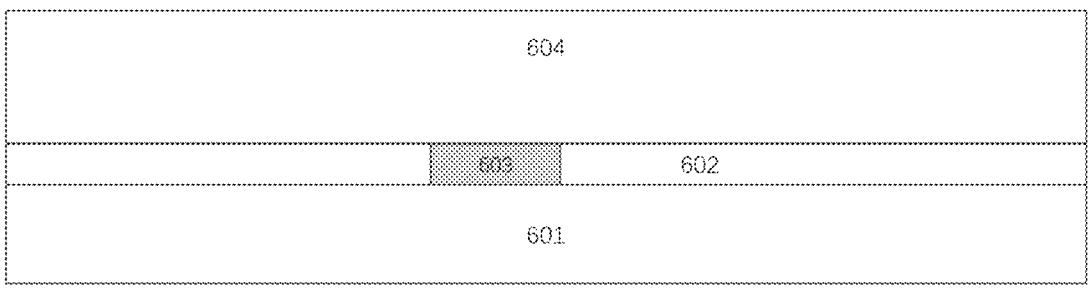
FIG. 6 is a schematic diagram showing forming processes of the device structure of HEMTs provided in an embodiment of the present disclosure.
Figure 7:
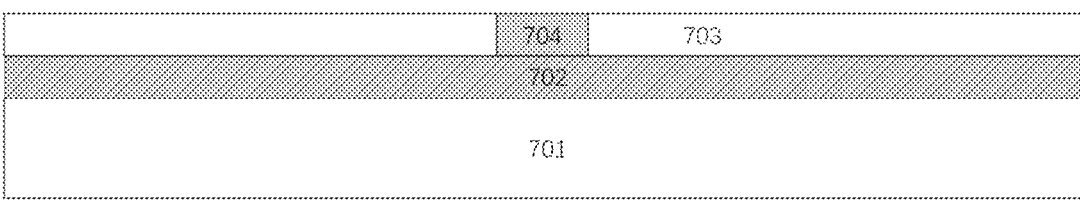
FIG. 7 is a schematic diagram showing forming processes of the device structure of HEMTs provided in another embodiment of the present disclosure.
Figure 8:
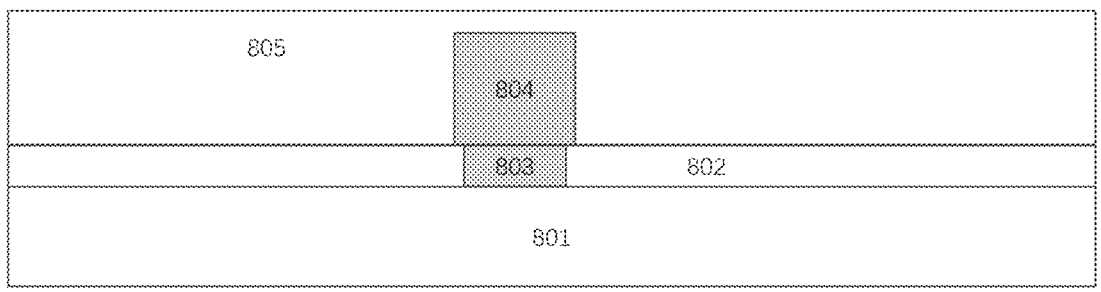
FIG. 8 is a schematic diagram showing forming processes of the device structure of HEMTs provided in another embodiment of the present disclosure.

The nucleation layers of FIGS. 2-5 and the epitaxial growth processes may be formed in the manners as shown in FIGS. 6-8 or in other feasible manners.

As shown in FIG. 6, an insulating layer 602 is formed on a substrate 601, wherein the insulating layer 602 is provided with an opening region by a process such as masking and etching, a nucleation layer 603 is epitaxially grown at the opening region, and a P-type nitride semiconductor layer 604, which serves as a channel layer, is formed on the nucleation layer 603 by selective/lateral epitaxial growth.

As shown in FIG. 7, a nucleation layer 702 is epitaxially grown on a substrate 701, and then an insulating layer 703 is formed, the insulating layer 703 is provided with an opening region 704 by a process such as masking and etching to expose the nucleation layer 702, and then a P-type nitride semiconductor layer is epitaxially formed on the nucleation layer 702 at the opening region 704 by selective/lateral epitaxial growth.

As shown in FIG. 8, an insulating layer 802 is formed on a substrate 801, the insulating layer 802 is provided with an opening region by a process such as masking and etching, a nucleation layer 803 is epitaxially grown at the opening region, and a buffer layer 804 is first formed on the nucleation layer 803 to improve crystal quality. The buffer layer 804 may be a strongly doped P-type region in a nitride semiconductor layer 805, such as a strongly doped P-type strong P-GaN layer, and the strong P-GaN layer can also serve as a strongly doped P-type region that forms good ohmic contact with an electrode.

For silicon substrates, the nucleation layer is typically an AlN layer, which facilitates reducing lattice mismatch between the substrate material and Group III nitride semiconductor material layer and avoiding the melt-back effect of the Ga source. At the time of selectively/laterally epitaxially growing the P-type nitride semiconductor layer on the nucleation layer or the buffer layer, the gas mixture containing a precursor includes a hydrogen component, which is more conducive to laterally growing a P-type nitride semiconductor layer having good performance by selective epitaxial growth (SEG). Moreover, nucleation is undesirable on the insulating layer during the selective/lateral epitaxial growth, so as to prevent the growth quality of the P-type nitride semiconductor layer from being affected, and it is necessary to control the formation of nucleation core and the growth of low-quality nitride semiconductor on the insulating layer in the growth process. In particular, a gas mixture of chlorine can be used to maintain a certain etching rate for the weakly grown core on the insulating layer in the technological process by utilizing the etching action of the Cl-containing atmosphere, so as to control the weakly grown core at an extremely low degree. The etching rate by the Cl-containing atmosphere for the high-speed grown P-type nitride semiconductor layer that is selectively/laterally epitaxially grown on the nucleation upper layer does not affect the growth of the P-type nitride semiconductor layer. That is to say, the selective etching effect of the Cl atmosphere is advantageous to the control of the quality of the P-type nitride semiconductor layer which is selectively/laterally epitaxially grown. In the present disclosure, a precursor mixture atmosphere containing hydrogen and/or chlorine is particularly used in the selective/lateral epitaxial growth of the P-type nitride semiconductor layer.

In addition, different doping doses may be selectively employed over the entire surface of the P-type nitride semiconductor layer according to the functions to form different doping distributions of weak P-type, strong P-type, or other regulated P-type nitride semiconductor layers. The concentration distribution over the entire surface of the P-type nitride semiconductor layer to be grown can be controlled by controlling the amount of P-type dopant at different stages of epitaxial growth, so as to facilitate regulation of the electric field distribution, and a high-quality P-type doped nitride semiconductor layer and the spatial regulation thereof can be obtained by the electric field distribution regulating technique.

Figure 9:
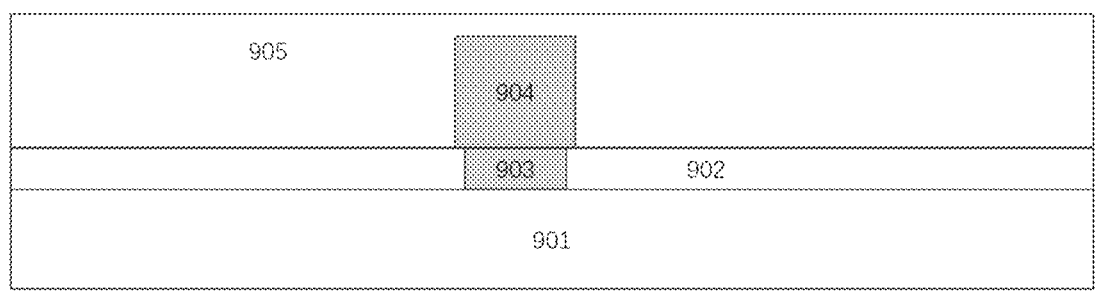
FIG. 9 is a schematic diagram showing forming processes of the device structure of HEMTs provided in another embodiment of the present disclosure.

As also shown in FIG. 9, an insulating layer 902 is formed on a substrate 901, the insulating layer 902 is provided with an opening region by a process such as masking and etching, a nucleation layer 903 is epitaxially grown at the opening region, and a P-type nitride semiconductor layer 905, which serves as a channel layer, is formed on the nucleation layer by selective/lateral epitaxial growth. After the completion of the growth of the P-type nitride semiconductor layer 905, a strongly doped P-type region 904 can be formed by local ion implantation of P-type impurities, which is advantageous to the formation of control of ohmic contact with the P-type nitride semiconductor layer 905.

Figure 10:
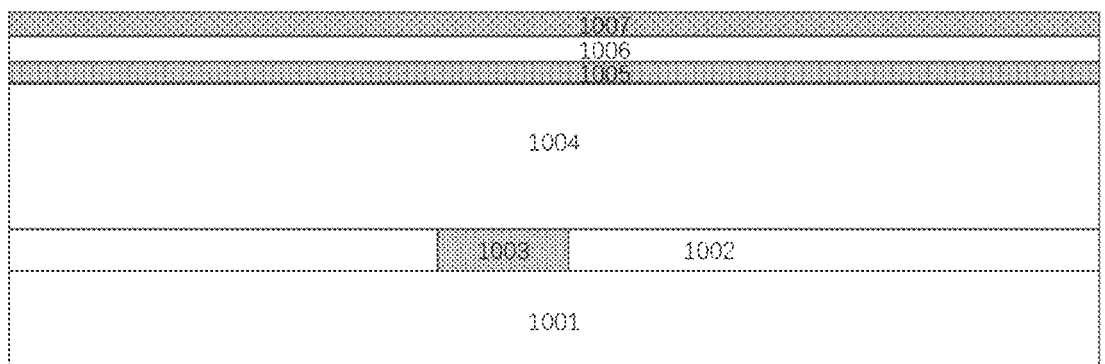
FIG. 10 is a schematic diagram showing forming processes of the device structure of HEMTs provided in another embodiment of the present disclosure.

As further shown in FIG. 10, an insulating layer 1002 is formed on a substrate 1001, the insulating layer 1002 is provided with an opening region by a process such as masking and etching, a nucleation layer 1003 is epitaxially grown at the opening region, a P-type nitride semiconductor layer 1004 is formed on the nucleation layer by selective/lateral epitaxial growth, and then other structures such as a channel layer 1005, a barrier layer 1006 and a passivation layer 1007 are formed in order. Since the channel layer has a very low doping concentration or is not intentionally doped, ion scattering of the two-dimensional electron gas during transfer can be effectively reduced. The barrier layer 1006 is deposited, and then an in-situ SiN passivation layer 1007 is deposited in the same deposition apparatus. That is, the epitaxial wafer is not taken out after the deposition of the barrier layer 1006 is completed, and the in-situ SiN passivation layer 1007 is further deposited directly in the same apparatus. The SiN passivation layer can effectively protect the surface of the barrier layer 1006 and has very high quality. The resultant barrier layer/$SiN_x$ interface has fewer defect states. The in-situ SiN layer can have passivation effect on the surface of the barrier layer, and it is also feasible to retain only the SiN layer of a region preset for the gate electrode via an etching procedure, and the region of the SiN layer serves as a gate dielectric layer to be used at the gate stack.

It should be noted that the P-type nitride semiconductor layer can serve as a channel layer and be in direct contact with the barrier layer. However, since doping in the P-type nitride semiconductor layer will result in significant carrier scattering effect, it is an option to generate an unintentionally doped or low doped channel layer between the barrier layer and the P-type nitride semiconductor layer, then scattering received by the two-dimensional electron gas when flowing through the channel layer can be greatly weakened. To insert a channel layer is an optional choice, rather than an indispensable choice.

Insulating layers 1102, 1202 are respectively formed on substrates 1101, 1201, the insulating layers are each provided with an opening region by a process such as masking and etching, nucleation layers 1103, 1203 are epitaxially grown at the opening regions respectively, strongly doped P-type regions 1110, 1211 are respectively formed on the nucleation layers 1103, 1203 by selective/lateral epitaxial growth, and then P-type nitride semiconductor layers 1104, 1204 are epitaxially grown. After the completion of the growth of the P-type nitride semiconductor layers 1104, 1204, the strongly doped P-type regions 1110, 1211 can be formed by local ion implantation of P-type impurities, which is conducive to ohmic contact between the respective electrodes and the P-type nitride semiconductor layers. On the P-type nitride semiconductor layers 1104, 1204, channel layers 1105, 1205 are formed respectively, barrier layers 1106, 1206 are further formed, and then source electrodes 1107, 1207, gate electrodes 1109, 1209, and drain electrodes 1108, 1208 are formed respectively, the drain electrodes 1108, 1208 are in electrical contact with the two-dimensional electron gas above the channel layers 1105, 1205 respectively, and in the embodiment shown in FIG. 12, a body electrode 1210 and the like are further provided.

Figure 11:
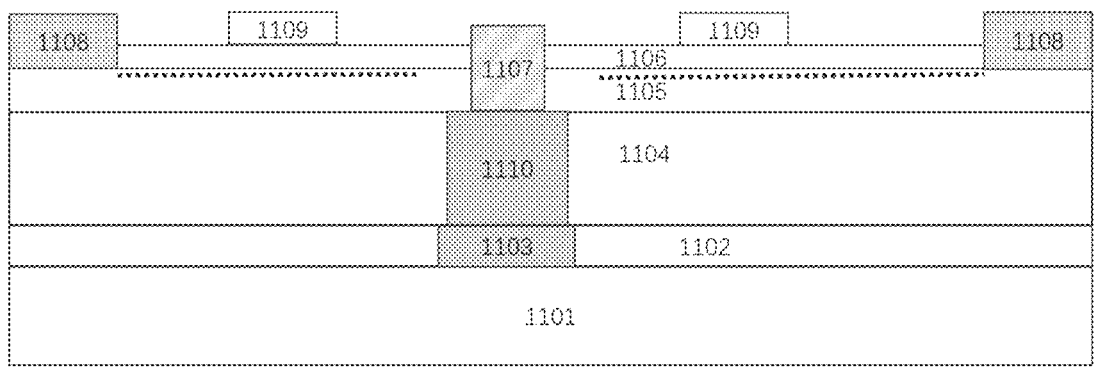
FIG. 11 shows the device structures of HEMTs provided in an embodiment of the present disclosure.

In the embodiment shown in FIG. 11, the source electrode 1107 passes through the two-dimensional electron gas to be connected with the strongly doped P-type region 1110 in the P-type nitride semiconductor layer 1104, the drain electrode(s) 1108 is(are) in contact with the two-dimensional electron gas on the channel layer 1105, and the gate electrode(s) 1109 is(are) located on the barrier layer 1106. In this device structure, the electric potential of the source electrode 1107 is generally fixed at 0 V, and in normally off state and on state, the HEMT is realized by controlling the different voltages of the gate and the drain.

Figure 12:
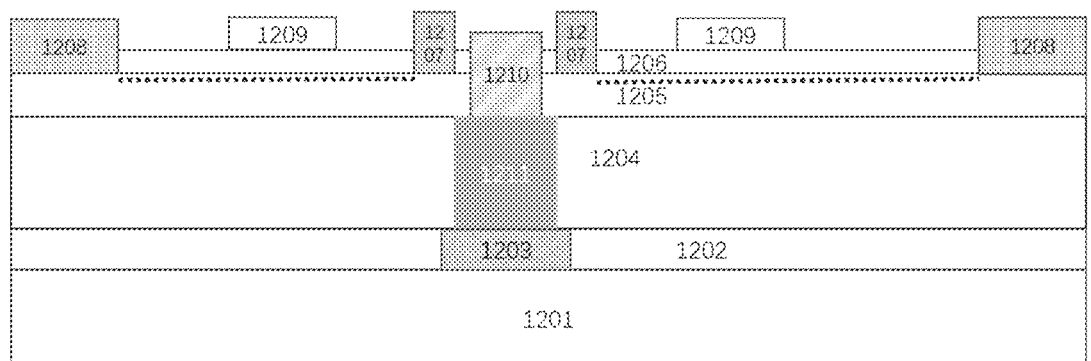
FIG. 12 shows the device structures of HEMTs provided in another embodiment of the present disclosure.

In the embodiment shown in FIG. 12, the source electrode 1207 and the drain electrode 1208 are in contact with the two-dimensional electron gas on the channel layer 1205, and the gate electrode 1209 is on the barrier layer 1206. The electric potential of the P-type nitride semiconductor layer 1204 is controlled separately by the body electrode 1210 forming good ohmic contact with the strongly doped P-type region 1211 in the P-type nitride semiconductor layer 1204. In normally off state and on state operations, the HEMT is realized by controlling different voltage potentials of the gate electrode, the source electrode and the drain electrode, and the voltage potential of the P-type nitride semiconductor layer 1204. By independently controlling the electric potential of the body electrode 1206, a quick turn-off operation of the HEMT can be realized.

Figure 13:
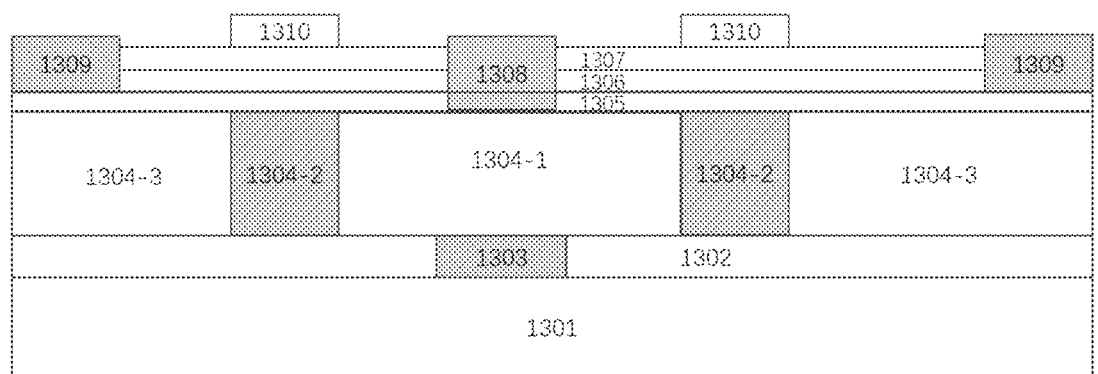
FIG. 13 shows the device structures of HEMTs provided in another embodiment of the present disclosure.
Figure 14:
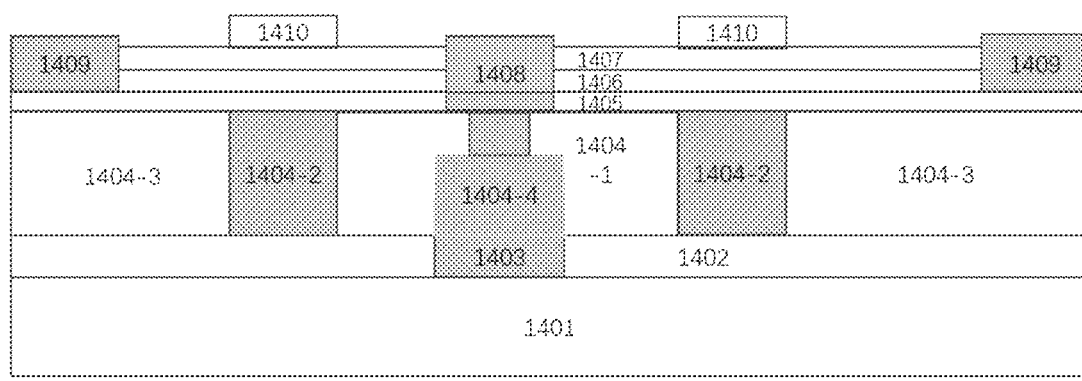
FIG. 14 shows the device structures of HEMTs provided in another embodiment of the present disclosure.

In the embodiments shown in FIG. 13 and FIG. 14, the functional layers are exemplary.

Insulating layers 1302, 1402 are respectively formed on substrates 1301, 1401, the insulating layers 1302, 1402 are each provided with an opening region by a process such as masking and etching, nucleation layers 1303, 1403 are epitaxially grown at the respective opening regions, and P-type nitride semiconductor layers 1304, 1404 are respectively formed on the nucleation layers 1303, 1404 by selective/lateral epitaxial growth.

At the time of epitaxially growing the P-type nitride semiconductor layers 1304, 1404, first P-type regions (1304-1, 1404-1) of the respective nitride semiconductor layers, first strong P-type regions (1304-2, 1404-2) of the respective nitride semiconductor layers and second P-type regions (1304-3, 1404-3) of the respective nitride semiconductor layers are formed in order by the doping-modulation technique, wherein the first strong P-type regions (1304-2, 1404-2) of the nitride semiconductor layer are under the gate electrode and can deplete the two-dimensional electron gas in the channel layer under the gate electrode 1410 by 95% or more under a zero bias voltage.

Channel layers 1305, 1405 and barrier layers 1306, 1406 are formed in order on the P-type nitride semiconductor layers 1304, 1404 respectively, gate electrodes 1310, 1410 are formed on the respective barrier layers 1306, 1406, and drain electrodes 1309, 1409 are provided in the respective barrier layers to be in electrical connection with the two-dimensional electron gas. In the embodiment shown in FIG. 13, after being subjected to the procedures such as masking and etching, the source electrode 1308 passes through the channel layer 1305 to come into electrical contact with the first P-type region (1304-1) of the nitride semiconductor layer, the electric potential of the P-type nitride semiconductor layer 1304 is controlled to be consistent with that of the source electrode 1308, which, for example, can be fixed at 0 V, and the turn-on and turn-off of the enhancement HEMT can be controlled just by controlling the electric potentials of the gate electrode 1310 and the drain electrode 1309. In the embodiment shown in FIG. 14, after the completion of the growth of the P-type nitride semiconductor layer 1404, a strongly doped P-type region 1404-4 can be formed by local ion implantation of P-type impurities, and after being subjected to the procedures such as masking and etching, the source electrode 1408 passes through the channel layer 1405 to come into electrical contact with the strongly doped P-type region 1404-4 of the P-type nitride semiconductor layer 1404. The strongly doped P-type region 1404-4 facilitates ohmic contact between the source electrode and the P-type nitride semiconductor layer and reduces on resistance, and also facilitates realizing accurate control of the electric potential of the P-type nitride semiconductor layer 1404. The electric potential of the P-type nitride semiconductor layer 1404 is controlled to be consistent with that of the source electrode 1408, which, for example, can be fixed at 0 V. The turn-on and turn-off of the enhancement HEMT can be controlled just by controlling the potentials of the gate electrode 1410 and the drain electrode 1409.

In the embodiments shown in FIG. 13 and FIG. 14, at the end of epitaxial growth of the second P-type regions (1304-3, 1404-3) of the respective nitride semiconductor layers, i.e., the growth getting close to a region preset for the drain electrode, the doping concentration is adjusted to be relatively low or no doping is performed, so as to enable very good current conduction capability in on-state, while enhancing the voltage endurance capability of the device. After the completion of selective/lateral epitaxial growth, the upper surface nitride semiconductor layer can be partially removed by a planarization or etching process, and then the barrier layer structure or the channel layer and barrier layer structure can be epitaxially formed, so as to avoid negative effects from different concentrations of doping on the device structure on the channel layer. The source electrode is disposed on the P-type nitride semiconductor layer corresponding to the opening region of the nucleation layer, and the selective/lateral epitaxial growth is radially extended with the projection surface region of the source electrode as the center, which facilitates covering the whole surface of the substrate at a high ratio. Optionally, a doping concentration of the P-type nitride semiconductor layer is controllably changed during the selective/lateral epitaxial growth to regulate the doping of the P-type nitride semiconductor layer according to different regions, and then an electrode structure is formed, wherein a projection plane of the source electrode on the substrate partially coincides with a projection plane of the nucleation layer on the substrate.

In addition, for the embodiments shown in FIG. 13 and FIG. 14, the manner of controlling electric potentials of the P-type nitride semiconductor layers may be as shown in FIG. 12, the source electrode and the drain electrode are provided only in the barrier layer to be electrically connected with the two-dimensional electron gas, and an additional body electrode is separately provided to be electrically connected with a region of the P-type nitride semiconductor layer (which is a strongly doped P-type region in the case of strong doping) on the nucleation layer, to independently control the electric potential of the P-type nitride semiconductor layer.

The above description is merely illustrative of preferred embodiments of the present disclosure, and is not intended to limit the scope of protection of the present disclosure. For a person skilled in the art, the present disclosure may have various changes and variations. Any modifications, equivalent substitutions, improvements etc. within the spirit and principle of the present disclosure shall all be included in the scope of protection of the present disclosure.

INDUSTRIAL APPLICABILITY

The P-type nitride semiconductor layer of the present disclosure is formed by selective/lateral epitaxial growth, the P-type doping concentration can regulate the proportion of the doped carrier gas atmosphere in the growth process as needed, and the electric field distribution is regulated by P-type doping; therefore, high-quality P-type doping and spatial regulation thereof on the two-dimensional electron gas can be achieved, which avoids the non-uniform distribution due to local ion implantation of P-type impurities and the resultant remarkable carrier scattering effect, as well as carrier scattering and generation of certain leakage channels caused by high-temperature annealing irrecoverability of the portion damaged by ion implantation. It is therefore very beneficial to realize high-quality control of P-type doping and hole distribution. With the lateral/selective epitaxy technique in combination with the technique of regulating electric field distribution by P-type doping, the present disclosure can obtain high-quality P-type doping and spatial regulation thereof, which improves the voltage endurance capability of the HEMT, and can realize enhancement devices by doping modulation; and avoids the problem of weak voltage endurance performance of the conventional HEMT devices due to the fact that the source and drain electrodes is only in electrical contact with the two-dimensional electron gas, resulting in incapability of controlling or regulating the electric potential of the P-type nitride semiconductor layer, and incapability of differentially controlling the operation of the electron gas of each doped region.

The invention claimed is:

1. A high-electron-mobility transistor comprising:
a gate electrode,
a source electrode,
a drain electrode,
a barrier layer,
a P-type nitride semiconductor layer and a substrate, the P-type nitride semiconductor layer is between the barrier layer and the substrate, which is insufficient to significantly deplete a two-dimensional electron gas in a channel except a gate stack, the source electrode is in electrical contact with the P-type nitride semiconductor layer, and the source electrode and the drain electrode are both in electrical contact with the two-dimensional electron gas, and
an independent body electrode which is in electrical contact with the P-type nitride semiconductor layer.

2. The transistor according to claim 1, further comprising a nucleation layer between the P-type nitride semiconductor layer and the substrate.

3. The transistor according to claim 1, further comprising a low doped or unintentionally doped nitride semiconductor layer between the barrier layer and the P-type nitride semiconductor layer.

4. The transistor according to claim 1, wherein a portion of the P-type nitride semiconductor layer which is in contact with the source electrode has a larger doping concentration than a portion of the P-type nitride semiconductor layer which is not in contact with the source electrode.

5. The transistor according to claim 1, wherein the P-type nitride semiconductor layer is formed by selective/lateral epitaxial growth.

6. The transistor according to claim 5, wherein during the selective/lateral epitaxial growth of the P-type nitride semiconductor layer, doping of P-type nitride semiconductor layer is regulated by controlling the doping concentration according to different regions.

7. The transistor according to claim 5, wherein light doping or no doping is performed when the selective/lateral epitaxial growth of the P-type nitride semiconductor layer gets close to a portion preset for the drain electrode.

8. The transistor according to claim 5, wherein after the selective/lateral epitaxial growth is completed, the P-type nitride semiconductor layer is partially removed in height direction by a planarization or etching process.

9. The transistor according to claim 1, wherein an insulating layer is provided on the substrate, an opening region is formed on the insulating layer by etching, a nucleation layer is formed at the opening region, and an epitaxial layer structure comprising the P-type nitride semiconductor layer is grown by means of selective/lateral epitaxy; or a nucleation layer is grown on the substrate, an insulating layer is formed on the nucleation layer, an opening of the insulating layer exposes the nucleation layer, and an epitaxial layer structure comprising the P-type nitride semiconductor layer is formed by the selective/lateral epitaxial growth.

10. The transistor according to claim 9, wherein prior to growing the P-type nitride semiconductor layer, a buffer layer, which is a layer of a highly doped P-type nitride semiconductor material, is formed on the nucleation layer.

11. The transistor according to claim 1, wherein except a region of the gate stack, under a zero bias voltage, the concentration of channel two-dimensional electron gas depleted by the P-type nitride semiconductor layer is smaller than 80% of the concentration of the channel two-dimensional electron gas formed by P-type doping in a semiconductor layer that does not contain P-type nitride.

12. The transistor according claim 1, wherein at the time of forming the P-type nitride semiconductor layer, a first P-type region of the nitride semiconductor layer, a first strong P-type region of the nitride semiconductor layer and a second P-type region of the nitride semiconductor layer are formed in order, wherein the first P-type region of the nitride semiconductor layer is under the source electrode, the first strong P-type region of the nitride semiconductor layer is under the gate electrode, the second P-type region of the nitride semiconductor layer is under the drain electrode, and the first strong P-type region of the nitride semiconductor layer can deplete the two-dimensional electron gas in at least a portion of the channel layer below the gate electrode by 95% or more, under a zero bias voltage.

13. The transistor according to claim 1, wherein light doping or no doping is performed when the selective/lateral epitaxial growth of the P-type nitride semiconductor layer gets close to a portion preset for the drain electrode.

14. The transistor according to claim 1, wherein after the completion of the growth of the P-type nitride semiconductor layer, a low doped or undoped semiconductor layer is further grown, thereby realizing undoping of the channel layer on the upper surface of the P-type nitride semiconductor layer.

15. The transistor according to claim 1, wherein after the selective/lateral epitaxial growth is completed, the upper surface nitride semiconductor layer is partially removed by a planarization or etching process, and then a barrier layer structure or a channel layer and barrier layer structure is epitaxially formed.

16. The transistor according to claim 1, wherein at the time of forming the P-type nitride semiconductor layer, a first P-type region of the nitride semiconductor layer, a first strong P-type region of the nitride semiconductor layer and a second P-type region of the nitride semiconductor layer are formed in order, wherein the first P-type region of the nitride semiconductor layer is under a body electrode, the first strong P-type region of the nitride semiconductor layer is under the gate electrode, the second P-type region of the nitride semiconductor layer is under the drain electrode, and the first strong P-type region of the nitride semiconductor layer can deplete the two-dimensional electron gas in at least a portion of the channel layer under the gate electrode by 95% or more under a zero bias voltage.

17. The transistor according to claim 16, wherein at the time of forming the P-type nitride semiconductor layer, after the first P-type region of the nitride semiconductor layer, the first strong P-type region of the nitride semiconductor layer and the second P-type region of the nitride semiconductor layer are formed in order, ion implantation is performed in a portion of the first P-type region of the nitride semiconductor layer which is connected with the body electrode so as to form a strongly doped P-type region, the body electrode is connected with the strongly doped P-type region to form an ohmic contact, the first strong P-type region of the nitride semiconductor layer is under the gate electrode, the second P-type region of the nitride semiconductor layer is under the drain electrode, and the first strong P-type region of the nitride semiconductor layer can deplete the two-dimensional electron gas in at least a portion of the channel layer under the gate electrode by 95% or more under a zero bias voltage.

18. The transistor according to claim 1, wherein after the growth of the P-type nitride semiconductor layer, a highly doped P-type region of the nitride semiconductor layer is formed on the nucleation layer.

19. The transistor according to claim 1, wherein after the formation of the barrier layer, a $SiN_x$ passivation layer is grown in situ.

20. The transistor according to claim 1, further comprising a gate insulating layer under the gate electrode, wherein the gate insulating layer is configured to reduce an off-state leakage current of the gate.

21. The transistor according to claim 1, wherein a mixture atmosphere having a precursor containing hydrogen and/or chlorine is used in the selective/lateral epitaxial growth of the nucleation layer.

22. The transistor according to claim 1, wherein a precursor mixture atmosphere containing hydrogen and/or chlorine is used in the selective/lateral epitaxial growth of the P-type nitride semiconductor layer.

23. The transistor according to claim 1, wherein the P-type nitride semiconductor layer is at least partially in a region between the source electrode and the gate electrode and a region between the gate electrode and the drain electrode.

24. The transistor according to claim 1, wherein except the gate stack region, under a zero bias voltage, the concentration of the channel two-dimensional electron gas depleted by the P-type nitride semiconductor layer is smaller than 80% of the concentration of the channel two-dimensional electron gas formed by P-type doping in a semiconductor layer that does not contain P-type nitride.

25. A method for preparing the high-electron-mobility transistor according to claim 1, comprising steps of forming a P-type nitride semiconductor layer on the nucleation layer by selective/lateral epitaxial growth, controllably changing a doping concentration of the P-type nitride semiconductor layer during the selective/lateral epitaxial growth to regulate the doping of the P-type nitride semiconductor layer according to different regions, and then forming an electrode structure, wherein a projection plane of the source electrode on the substrate partially coincides with a projection plane of the nucleation layer on the substrate.

26. The method according to claim 25, wherein a precursor mixture atmosphere containing hydrogen and/or chlorine is used in the selective/lateral epitaxial growth of the P-type nitride semiconductor layer.

* * * * *